United States Patent [19]

Barlow

[11] Patent Number: 4,594,677

[45] Date of Patent: Jun. 10, 1986

[54] SYSTEM FOR DETECTING AND DIAGNOSING NOISE CAUSED BY SIMULTANEOUS CURRENT SWITCHING

[75] Inventor: John P. Barlow, Owego, N.Y.

[73] Assignee: International Business Machines Corporation, Armonk, N.Y.

[21] Appl. No.: 550,150

[22] Filed: Nov. 9, 1983

[51] Int. Cl.$^4$ ............... G01R 31/28; G06F 15/31
[52] U.S. Cl. ............... 364/578; 324/73 R; 371/23
[58] Field of Search ............... 364/578, 481; 371/15, 371/17, 20, 22, 23, 26; 324/73 R, 73 AT

[56] References Cited

U.S. PATENT DOCUMENTS 3,961,250  6/1976  Snethen ............... 371/20
4,228,537 10/1980  Henckels ............... 371/20
4,434,489  2/1984  Blyth ............... 371/20
4,481,628 11/1984  Pasquinelli ............... 324/73 R X

FOREIGN PATENT DOCUMENTS 0096176 12/1983 European Pat. Off. ............ 364/578

OTHER PUBLICATIONS

Barto et al., "A Computer Architecture for Digital Logic Simulation", Sep. 1980, Electronic Eng., pp. 35–66.

Primary Examiner—Felix D. Gruber
Assistant Examiner—Thomas G. Black
Attorney, Agent, or Firm—Mark Levy

[57] ABSTRACT

A system for detecting and diagnosing noise caused by current switching in a computerized simulation model for analyzing composite logic circuits. The system includes a logic simulator for simulating logic experiments, a noise contributor information file generator for providing identification data corresponding to each current switching device that contributes noise and for performing post analysis of the results of a simulation, a noise activity file generator for creating an activity file of events derived from the simulation results, that represent the operation of current switching devices identified by the noise contributor information file generator and a noise calculator-analyzer for determining the amount of noise created by each noise contributing current switching device and for measuring the total instantaneous noise at each event in the activity file.

37 Claims, 5 Drawing Figures

SYSTEM FOR DETECTING AND DIAGNOSING NOISE CAUSED BY SIMULTANEOUS CURRENT SWITCHING

BACKGROUND OF THE INVENTION

1. Field of the Invention

The present invention relates to a system for detecting and diagnosing problems due to excessive levels of current switching noise and more particularly to noise generated by pre-identified contributors of switching noise.

2. Description of the Prior Art

Computers can be used to assist in the design, development and production of complex systems. The technological evolution of electronic computer systems over the past thirty years has been made possible by the use of computers themselves to assist in designing new generations of computers.

The dramatic rate of change in the circuits and packages used as building blocks by digital circuit designers has been the predominant influence on the evolution of computer systems. Design complexity has also grown with the increase in the number of package levels which product designers personalize. In early technology, the circuit cards consisted primarily of a predesigned set. The specification of the panel and cable wiring was the essential physical design variable. Later the cards became more unique and design of the circuit cards became an additional physical package design variable. LSI brought with it the requirement for designing chips.

While the initial approach to assisting engineers in reaching accuracy goals was to compare the detailed design with sets of predefined rules, attention has recently been given to helping with the analysis of a design's functionality. This process is called design verification. Design verification denotes a host of tasks performed by a logic design engineer in order to ascertain the correctness of his design. There are several reasons for the engineer to verify his design. The initial specification of the design is basically behavioral, is often expressed informally in prose and contains inherent ambiguities. Designers require a procedure to ensure that their design is a correct implementation of the specification.

Also, the complexity of the design forces designers to think in terms of multiple conceptual levels. In particular, the detailed implementation of some portions of the design may affect the general design of other portions. Thus, implementation constraints and the interactions between portions of the design often prevent a pure "top-down" design process. The designer needs tools capable of verifying the correctness of a mixed model of the design (e.g., with regard to logic function, delays, timing, etc.), with each portion described on an appropriate conceptual level. Design iterations are commonplace, as conflicting partial solutions are resolved. Again, verification tools are needed to check self-consistency of the total design.

Lastly, human errors and oversights are unavoidable because of the size and complexity of the designs being considered. Thus, tools are needed to check for such problems whenever manual intervention occurs during the design process.

Without computer simulation systems, engineers are forced to build physical hardware prototypes to validate their designs. Early LSI technology users often constructed a prototype in a pre-LSI technology. A need was developed for logic simulation tools to aid in design verification and to alleviate the need for hardware modeling. Due to the difficulty of prototyping dense LSI technologies, simulation and modeling has become a widely accepted practice.

In computer simulation systems, the primary data base is organized for random access processing. All types of design data (logical, physical, control and the like) can be stored for all levels of packaging. This structure avoids many of the problems inherent with serial access systems.

Moreover, the data structure is parameterized so that it can be adapted to varying packaging nomenclatures and requirements. This allows the system to accommodate designs which include many varieties of chips, modules, cards, planars and boards.

Methods of segmenting the data base have been developed to accomplish hierarchical processing. This allows the chips to be designed independently of, but in parallel with, the module or card. When the chip design is complete, the necessary data is available for completing the processing of the next level of package. Since the necessary data is a small subset of the entire chip design data, very dense second- and third-level packages can be processed. Test pattern generation and design verification capabilities are generally provided.

Programs have been implemented to audit the design process. This allows the system to ensure that the right level of technology rules is used, that the design, checking and test-generation programs all run successfully, that no severe design errors are detected and, most importantly, that if the design data were changed during the process, the necessary programs are rerun to ensure total design data integrity prior to manufacturing. This feature has promoted a design discipline which has made masterslice (gate array) chip design very reliable.

Simulation has been used for functional design verification in the recent past. The simulator can be a nominal delay simulator, utilizing the concept of significant event simulation. The significant event technique is important since it limits the amount of examination and calculations done by the simulator. By considering only those design elements which could possibly change logical state as a result of the latest change of state, running time is minimized. Settling due to oscillations is solved by introducing artificial delays sufficiently long for small spikes to disappear.

A significant development has been three-valued simulation. Three-valued algebra helps logic simulators detect and handle logic circuit hazard and race conditions. A third value, "X," is added to the stable Boolean values "0" and "1" to allow analysis of networks in which some signals are not in stable states.

It would be advantageous to use four-value modeling to allow more accurate results than those obtained by three-value simulation. In addition to "0," "1," and "X," a "U" value would be added, denoting an uninitialized value. At the start of simulation, all nets would be assigned the value U. In the course of simulation, Us would be replaced by other values. If any remain at the conclusion of the simulation, however, it would mean that specific nets were not affected by the stimulus applied, indicating either a design error or incomplete coverage by that stimulus.

It would also be advantageous to introduce varying degrees of delay and timing accuracies, namely, zero delay, unit delay, nominal delay and extreme delay. Any combination of value range and delay type appropriate to a phase of product development would be able to be chosen.

Space-efficient host packages have been developed for VLSI logic chips. The multichip module is such a package, increasingly used in modern high-performance data processing equipment.

Although multichip module packaging solves many design problems, it introduces or intensifies certain other design and manufacturing problems. Among the design problem categories affected is electrical noise. Among the several types of noise which can present design problems is switching or "Delta I" noise. This noise is generated by high current switchings in the undecoupled inductances of chip and module power and signal distribution networks. It is caused primarily by the switchings of interchip and intermodule drivers and by transmission line terminators used in high-speed interchip and intermodule signal nets. The Delta I noise contributions of chip internal gates are generally considered negligible.

The factors which can make Delta I noise a design problem in the logic of modern high-performance computers are the parallelism of the data flow paths, the high speed drivers used and the great difficulty of providing adequate decoupling capacitors for the effective inductance of a dense multichip module. When one Delta I noise contributor switches, many other logically related contributors are likely to do so. If, for example, many drivers within a given chip or within neighboring chips can switch simultaneously, there is a data-dependent potential for generating Delta I noise. This noise may be sufficient either to delay the desired switchings or to impress excessive amounts of Delta I noise into quiescent drivers and their receivers. The latter condition can cause the reading and retention of spurious data.

SUMMARY OF THE INVENTION

In accordance with the present invention, there is provided a system for detecting and diagnosing noise caused by current switching in a computerized simulation model for analyzing composite logic circuits. The system includes a logic simulator for simulating logic experiments, a noise contributor information file generator for providing identification data corresponding to each current switching device that contributes noise and for performing post analysis of the results of a simulation, a noise activity file generator for creating an activity file of events, derived from the simulation results, that represent the operation of current switching devices identified by the noise contributor information file generator and a noise calculator-analyzer for determining the amount of noise created by each noise contributing current switching device and for measuring the total instantaneous noise at each event in the activity file.

BRIEF DESCRIPTION OF THE DRAWINGS

A complete understanding of the present invention may be obtained by reference to the accompanying drawings, when taken in conjunction with the detailed description thereof and in which.

DESCRIPTION OF THE PREFERRED EMBODIMENT

Figure 1:
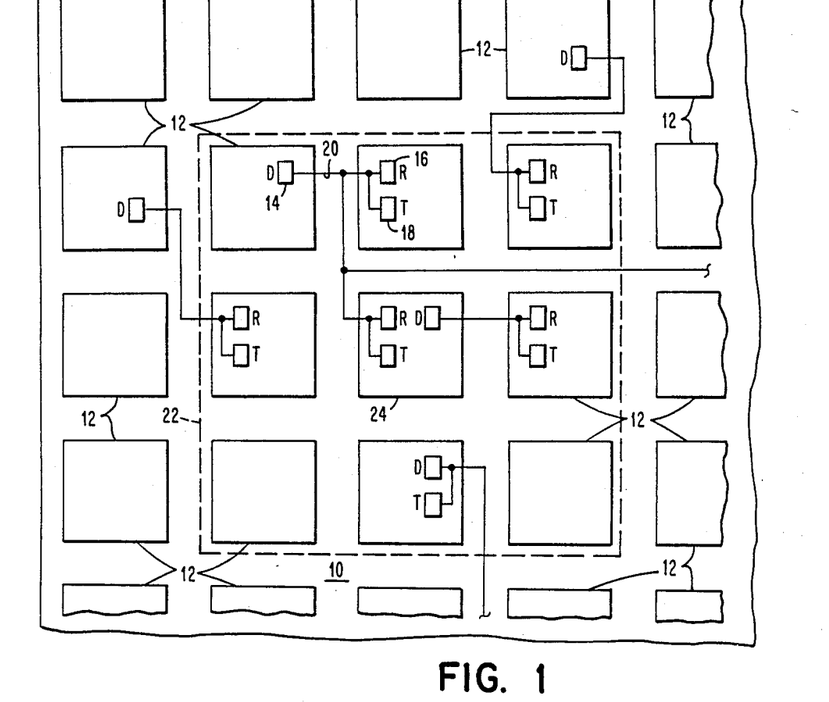
FIG. 1 is a schematic block diagram showing the interconnection of typical chips, off-chip drivers and terminator blocks on a multichip module.

Referring now to FIG. 1, there is shown a portion of a module 10 having a plurality of integrated circuit chips, shown generally at reference numeral 12. In at least some of the chips 12 are disposed logic devices such as drivers "D" 14 and receivers "R" 16. Also on the chips 12 are nonlogic devices such as terminators "T" 18. The drivers 14 are connected to the receivers 16 by means of lines 20.

The drivers 14 associated with noise impressed on any chip 12 may in fact be located off that chip 12 on the same module 10 or on another module, not shown. Similarly, terminators 18 may also be located off any chip to which they communicate noise. Module signal primary inputs (PIs) and primary outputs (POs), although essential, are not shown in FIG. 1.

A target area for simulating the experiment is defined generally at reference numeral 22, shown in phantom lines. In this FIGURE, nine chips 12 are defined as the target area 22. It should be understood, however, that the target area 22 may consist of as few as four chips 12 if near a vertex of the module 10. Similarly, six chips 12 may be included within the target area 22 if near an edge of the module 10. The primary chip of interest 24 is shown surrounded by eight secondary chips 12.

The chips 12 are interrelated with each other and may be interrelated with chips on another module, not shown. Thus, drivers 14 and terminators 18 may be not only off chip, but also off module.

Figure 2:
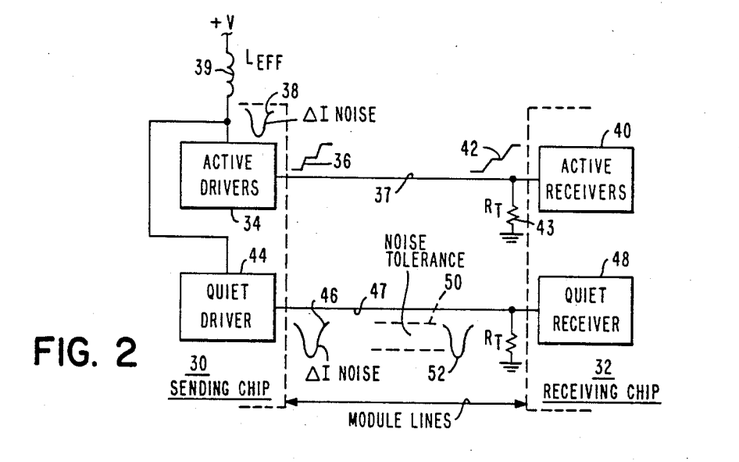
FIG. 2 is a graphic representation of the effect of switching noise.

Referring now also to FIG. 2, there is shown a graphical representation of signals generated by one chip and received by another. The sending chip is referred to as reference numeral 30 and the receiving chip is referred to as reference numeral 32. Both chips 30 and 32 have active as well as quiet components thereon. The active drivers 34, switching substantially simultaneously on the sending chip 30, provide positive going signals, represented collectively by reference numeral 36. These signals 36 have a flat, horizontal portion, due to the Delta I noise 38 generated by the simultaneous switching activity and the module effective inductance $L_{EFF}$ 39 on the chip 30.

The active driver signals 36 are received, over transmission lines 37 by receivers 40 on the receiving chip 32, referred to as reference numeral 42. The transmission line terminators $R_T$ 43 are present to eliminate signal reflection problems. The terminators $R_T$ 43 also introduce Delta I noise.

The sending chip 30 can also have a quiet driver 44 which is influenced by the switching of the active drivers 34. The Delta I noise impressed on the quiet driver 44 is shown at reference numeral 46. A single transmission line 47 connects the quiet driver 44 to the quiet receiver 48 on the receiving chip 32. A noise threshold or tolerance is shown in dashed lines as reference numeral 50. If a noise spike 52 exceeds the noise tolerance 50, then the quiet receiver 48 can interpret this noise level as a legitimate signal. This would be an erroneous interpretation.

As a secondary disadvantage to Delta I noise, it can be seen that the signal 36 from the active drivers 34 can be delayed by the horizontal portion of the signal 36.

Figure 3:
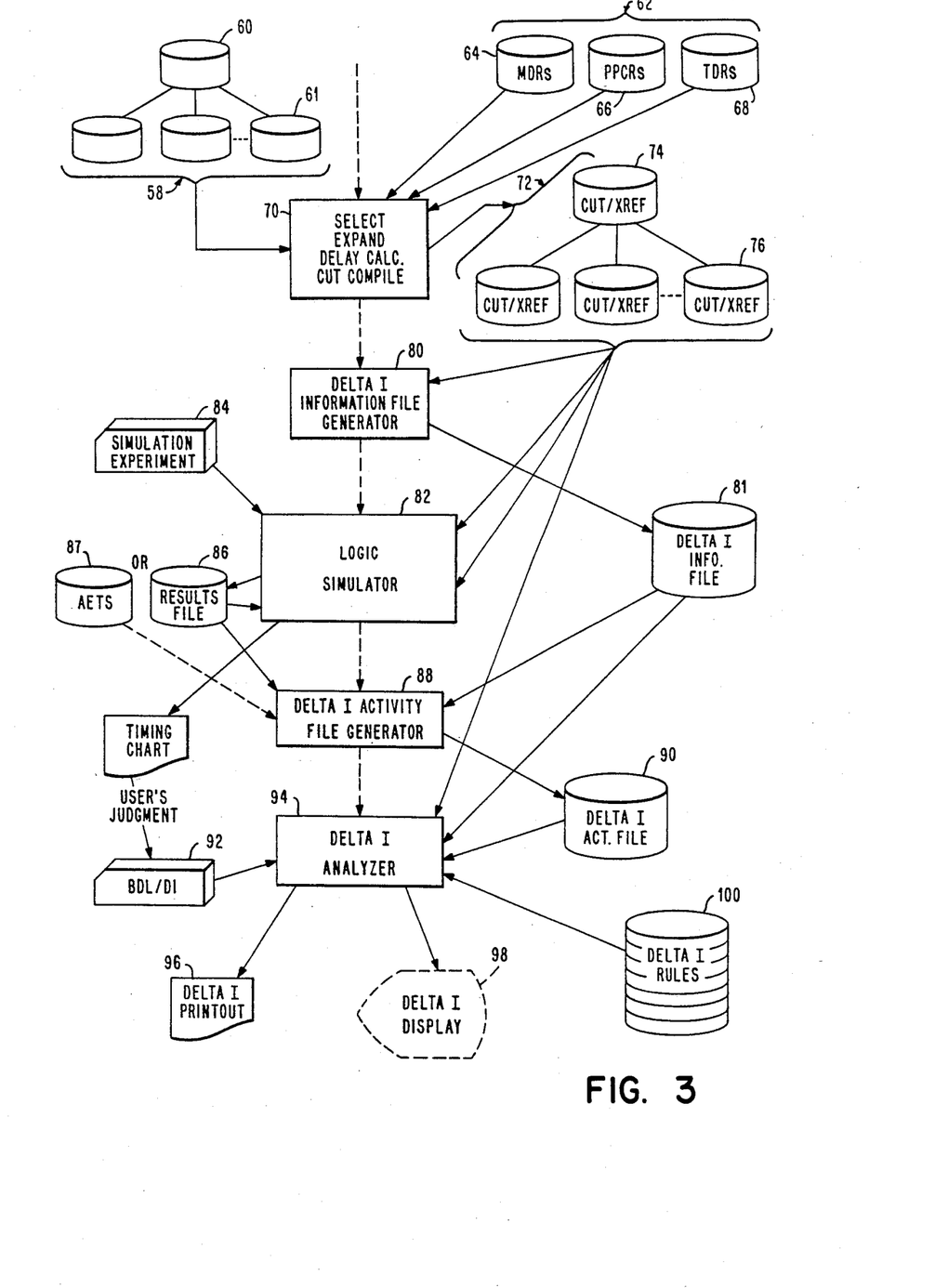
FIG. 3 is a system diagram in accordance with the present invention.

Referring now also to FIG. 3, there is shown a system diagram in accordance with the present invention.

A data base is shown generally at reference numeral 58. It contains files 60, each of which comprises logical, logical interconnection, delay information relating to all logical and electrical elements used on the assembly it describes, including Delta I noise contributors and the like. The data base 58 is hierarchical. It contains one file 60 representative of a module 10 and other files 61, each of which represents one chip 12 on the module 10.

A set of technology rules is shown generally at reference numeral 62. These rules 62 contain tabular or linguistic files 64 and 66 as well as executable programs 68.

A model definition rule (MDR) 64 represents a high level block in terms of the interconnected logical primitives that realize its function. It can also include any delay information associated with the signals. It also contains identification of Delta I simulatable noise contributors, which are usually drivers.

Package physical characteristics rules (PPCRs) 66 provide nomenclature for identifying the specific types of module 10 or chip 12 under consideration. This nomenclature is eventually used by the Delta I noise calculator-analyzer as hereinbelow described.

A group of programs called technology delay rules (TDRs) are shown at reference numeral 68. These programs 68 are used to calculate block delays. Also included in the programs 68 are routines for characterizing the nets on which noise contributors appear. This characterization accounts for differences in driven net electrical properties as functions of net topology and types and numbers of terminators used. It allows more accurate prediction of Delta I noise contributed by the net drivers.

Programs shown at reference numeral 70 are provided to select data from the data base 58, expand data in accordance with the MDR rules 64 and perform calculations based on the delay information provided by the TDR rules 68. The last function of the program 70 is to compile the information into formatting structure called CUTs and to provide cross-reference information between the internal information and user understandable information. The CUTs are hierarchical in nature and are shown generally at reference numeral 72. The CUTs 72 are organized in a hierarchical fashion corresponding to the hierarchy of the data base 58. That is, a module CUT 74 corresponds to the module level data base or physical work file 60, whereas chip CUTs 76 correspond to the chip level data base or physical work files 61.

A simulator 82 comprises a group of programs which are related to the Variable Mesh Simulator (VMS) subsystem. The VMS subsystem is described in "Design Automation in IBM", by P. W. Case, et al, IBM J. Res. Dev., Vol. 25, No. 5, page 631, September, 1981. It should be understood that while the simulator 82 in the preferred embodiment is the Variable Mesh Simulator, other simulators may be used. Likewise, a mode of simulation other than a real time nominal delay mode shown can be used, such as a static mode for the fault simulation of logic test patterns.

The simulator 82 reads a user defined experiment 84 and applies it to a simulation model from the structure 72.

Logic simulation experiments in support of Delta I noise analysis of a module 10 can be set up in exactly the same manner as are other system logic level simulation runs, via the standard VMS control language. The principal difference between such experiments and the design verification experiments which traditionally have been run is one of emphasis. A Delta I noise experiment is constructed with the aim of producing the worst possible switching activities in the physical entity being examined. Since accurate timings are essential, simulation is performed by the simulator 82 in a nominal delay mode, using either three-valued or four-valued logic.

All logical elements normally simulated in a system are simulated here, including those drivers which have been designated as significant contributors of Delta I noise. These elements and their input/output pins are referred to as Delta I Contributor-Simulatable (DICS). Transmission line terminators, being nonlogical elements, are not represented in the simulation model and, therefore, are not simulated. These elements and their pins are referred to as Delta I Contributor-Nonsimulatable (DICN). Terminators are handled in the noise activity file generator, hereinbelow described, which reads, interprets and supplements the system results.

The simulation results file 86 is a sequential file of simulation logic events. This file 86 is created by the simulator 82 and can be used to and generate timing charts for the user.

The Delta I information file generator 80 furnishes the user with a CUT-by-CUT printed document of Delta I contributors in the structure processed, in a format based primarily on the organization of the main table in the information file 81, as hereinbelow described. For each CUT, the information file 81 contains the CUT hierarchical usage name, the equivalent PPCR name, the numbers of DICS and DICN pins contained and a table of Delta I contributors (using hierarchical source and sink pin names), pin flags and values, DICN block delay data, multi-source net indication for drivers and I/O level flag bits.

Since unterminated drivers and their driven nets have significantly greater susceptibility to Delta I noise than do terminated drivers of the same respective types, the user should be made aware of any unterminated DICS drivers in the design. The organization of the Delta I information file 81 facilitates checking for this condition.

It can thus be appreciated that the noise contributor information file 81 provides a concise reference capability to the Delta I noise contributors and their placements and interconnections on the chip 12 and module 10 (FIG. 1). Every contributor in the module 10, whether driver 14 or terminator 18, is represented in this file 81. All noncontributing logic elements are omitted.

This file 81 is organized to allow efficient access by both simulation results post-processors: the noise activity file generator and the noise calculator-analyzer, both described hereinbelow. The information file 81 contains identification of the specific "type" of each noise contributor, multisource net ("dotted" or wired logic) definition data and transmission line delay data, in addition to other necessary descriptive information about Delta I noise contributors in the logic package under consideration. The file 81 is built from the simulation system structural data 72, to which minor additions are made to accommodate the special needs of Delta I noise analysis.

The Delta I information file 81 comprises three member tables: the main table, the multi-source net table and the DICN block delay and name table. The analyzer program uses only the main table.

Since the lengths of the data fields in the Delta I information file 81 can be made to be consistent for a given physical structure, but often vary from structure to structure as functions of the technologies used or their specific applications, a header record is used to define field lengths. Zero-length fields are allowed and field length can be internally determined. The header record also contains the PPCR name corresponding to the Delta I rule member for each CUT in the structure 72.

In the main table of this file 81 are entries corresponding to the Delta I contributor blocks in the total structure on which simulation and measurement are to be performed, with all DICN sink blocks in a multi-source net being shown as fanouts of each of the source blocks. Also in the main table are all primary inputs to the top CUT which include DICN blocks in their fanouts. Except for header record data, there are no entries in this file 81 for CUTs 72 representing vassal levels of the physical hierarchy which contain no Delta I contributing blocks.

It must be assumed that a non-simulatable block (DICN) cannot be a source. If it could, it would be impossible to conceive of a realistic, reasonable algorithm for synthesizing non-simulatable causative events from simulated or non-simulated successor events.

The results file 86 is read from beginning to end by a Delta I activity file generator 88. The activity file generator 88 has two functions. The first function is to discard all irrelevant simulation results and retain only relevant noise event information. Such relevant information are events on DICS blocks. During the aforementioned course of filtering events to determine whether they are relevant events which could generate noise events on previously unsimulatable elements (e.g., terminators), the activity file generator 88 performs its second function. It evaluates the noise events by examining each primary input or driver event and determining whether any terminators are in the driven net and whether, for multisource nets, events should be generated for such terminators. If an event can produce a change on the net which would be impressed on the terminator, that event on the terminator is generated. The event is suitably delayed by the delays corresponding to that net in the information file 80 and inserted into an activity file, hereinbelow described.

The result of this filtering and partial resimulation process is a file which is read and evaluated by the noise calculator-analyzer, described in detail hereinbelow.

A Delta I activity file 90 is generated by the activity file generator 88. This file 90 contains, in strict time-sequential order, simulation events on identified noise contributors. The header data of the simulation results file 86 is written out to the Delta I activity file 90 essentially unchanged. As commands beyond the header are read, they are either omitted or retained, evaluated and perhaps modified for writing onto the Delta I activity file 90. Although a given command type may not be retained, it may be used to control the commands actually placed on the activity file 90.

Commands are synthesized as hereinabove described and written to the Delta I activity file 90 for any blocks shown as fanout or successors (DICN-flagged) in the Delta I information file 81.

Events must be generated so as to occur later in time than their corresponding source events by an amount equal to the source-sink delay specified by the DICN block delay and name table of the Delta I information file 81. This delay is the transmission line delay between any given source and sink and for the value transition specified for the source events. Although they are assumed identical, both the rising signal delay (RDLY) and the falling signal delay (FDLY) values are specified in the delay and name table. RDLY and FDLY suffice for all value transitions between 0 and 1 and H, with RDLY used for source transitions from 0 to 1, 0 to H, and H to 1 and FDLY for 1 to 0, 1 to H, and H to 0. A more detailed description of these transitions is presented hereinbelow.

One exception to the general convention is that stimulus commands on primary inputs to the highest level of the physical structure, represented by the top CUT, are not mapped and written onto the Delta I activity file 90, although these PIs are contained in the Delta I information file 81 and cause the synthesis of successor events for any DICN-flagged sink blocks. Such PI entries in the Delta I information file 81 are recognizable by the zero entries in their flag value fields.

Another exception, of a different sort, is that when an event read from the simulation results file 86 is an event on any member of a multi-source net, either of DICS blocks or of primary inputs to the top CUT, a determination is made that the value on the net actually changes before any events on DICN-flagged sinks are generated. This is done by reference to the Delta I information file's main and multi-source net tables and to an internal table of present values for all Delta I noise contributors in the structure. The latter value table has a one-to-one correspondence with the entries of the Delta I information file 81. Initialization has previously set all present value fields to "U", irrespective of the source of the simulation results file 86 to be processed.

Like those on a simulation results file 86, events on a Delta I activity file 90 *never* regress in time. It is necessary to maintain the table of one byte "present value" fields for the blocks in the Delta I information file 81 and a queueing capability for delayed events to be written to the activity file 90 to support the mapping or synthesis of event commands. Queue length is no shorter in time than the longest DICN block source-sink delay in the structure 72.

Referring still to FIG. 3, a user may input control information 92 to identify the target area(s) 22 (FIG. 1) for analysis. That is, the user identifies the physical chips 12 on the module 10. The user may also update the Delta I noise rules 62 to a limited extent at this time. And time ranges may be defined in the activity file 90 for which the analysis should be performed. Finally, the user may also define noise contributor facilities and substitute (override) the original activity estimates at a given time. All of this information is input to a Delta I calculator-analyzer 94 which processes the information in accordance with steps shown in detail hereinbelow.

With an experiment run against a multichip module 10 and an activity file 90 which has been generated from the simulation results 86, the calculator-analyzer 94 can examine that file for a single chip 12, a group of chips 22 or the entire module 10. The designer must define to the calculator-analyzer 94, in its control language 92, which portion of the module 10 is to be examined, so that only the relevant events on the activity file 90 are applied to the noise calculation.

The calculator-analyzer 94 reads the activity file 90 from beginning to end or reads only a user-specified segment of it and selects those events which affect the user-selected module portion 22. It obtains, from the appropriate noise rule data set 100, the amount and duration of Delta I noise created by each event as a function of both the specific contributor type on which the event occurred and the logical sense of the event. It also algebraically adds the contributed noise increment. The result obtained is a measure of the instantaneous Delta I noise amplitude in the area of interest at the time of the most recent event. Should the instantaneous noise predicted exceed a rule-specified or user-specified maximum, an error message is produced for each such violation, indicating the time of the rule violation, the instantaneous noise amplitude and the active noise contributors at that time.

With these results, the logic designer is informed of potential Delta I noise problems and is able to make suitable modifications to the module design prior to releasing the design and building module hardware.

Because the simulation experiments for very large modules can be complex, the calculator-analyzer 94 can perform limited overrides of simulation results. This capability permits the designer to measure sensitivity to changes of simultaneity or to try modifications to experiments before rerunning logic simulation.

The Delta I calculator-analyzer 94 accepts the user's control input by means of a specialized control language. The language is a composite of statements created for Delta I analysis purposes. It utilizes the PPCR name which identifies a Delta I rule member 100 defining the maximum allowable Delta I noise value for the physical package on which Delta I is to be measured (e.g., a thermal conducting module—TCM).

The Delta I noise pulses contributed by switching drivers and terminators are of varying amplitudes, form-factors and durations as functions, not only of value transition, but of drivers and driven net type or terminator type. Therefore, these Delta I noise contributions cannot be added as constant values of fixed duration when they occur. Rather, the Delta I rule sections and subsections 100 describe the Delta I noise behavior of terminators and net characterized drivers, respectively. These rules 100 contain several entries for each allowed value transition, each of which is a value of instantaneous Delta I noise which "occurs" at a specified time relative to the basic terminator or driver event. Thus, the noise added is an approximation, by successive rectangles, of the noise pulse form-factor, amplitude and duration.

The analyzer 94 reads each event from the Delta I activity file 90, determines its relevance, scales the Delta I value(s) contributed according to the scale factors for secondary or higher chips of interest and for fanin from higher level packages or fanout to higher level packages. From the Delta I rules 100, the duration of the longest noise pulse possible is obtained. The analyzer 94 schedules (enqueues) for Delta I summation all resulting sub-events specified in the rules. The analyzer's scheduler properly interleaves sub-events for all base events occurring within the time specified by that longest pulse width.

To allow for the definition of multiple master slice types and corresponding Delta I rule members 100 for any given circuit family (logic technology), each Delta I rule member defining element Delta I noise contributions contains a flag value/index equivalence table. This table relates the flag value (from an MDR flag or net characterization) contained in the Delta I information file entry for each Delta I contributor to the corresponding entry in that rule member.

The rule members 100 are divided into global and local components and the local (tabular) data is stacked to facilitate later data access. By reference to the equivalence tables and knowing the order of the stacked tabular data, the analyzer 94 augments each entry in the in-core representation of the information file with the index to the appropriate rule section in-core, in order to make rule data reference efficient. A further processing efficiency increase results from the adjustment of in-core tabular Delta I rule value data into the incremental form. The analyzer 94 then only adds in the signed numbers indicated, which for any section or sub-section should sum to zero in each column, and does not perform subtractions.

The rule 100 defaults to the top or module CUT. The user can identfy the Delta I noise activity file 90 to be processed and can specify a threshold level of instantaneous Delta I noise activity, at or above which the Delta I analyzer 94 informs the user of the contributors, transitions, Delta I noise values and time. Default is to the maximum value allowed.

When an action statement is read, the program looks up in the header of the Delta I information file main table the PPCR name corresponding to the unpersonalized physical assembly represented by the module PPCR name. There is a one-to-one correspondence between PPCR names and Delta I Rule-members; thus the program brings into main storage the indicated Delta I rule member to access such global information as:

(a) the maximum allowable positive-going and/or negative-going Delta I noise activity;
(b) the maximum effective noise pulse width, if specified at that level of the Delta I rule hierarchy; and
(c) the scaling coefficient to apply to Delta I activity on all chips 12 adjacent to the primary chip of interest 24.

Then the program, by reference to the Delta I information file 81, finds the PPCR names corresponding to the vassal CUTs and brings into main storage the corresponding Delta I rule members 100.

In the preferred embodiment, the output from the Delta I calculator-analyzer 94 can be provided in hard copy form by a printer 96 or exhibited on a display 98. It should be understood that any suitable form of communication with the user may be implemented.

The Delta I noise contributions read from the Delta I rule members 100 for chips 12 during running of the Delta I anayzer 94 are based on values to be found on Delta I noise contributors lying in purely interchip nets of a TCM. When Delta I contributors lie in nets which are driven to PO's of the module 10 additional lead inductance is present and the Delta I noise values in the tables of the appropriate rule chip member 100 must be multiplied by a factor furnished in the global information section of the appropriate rule module member to account for the resulting increase in Delta I noise generated. The general condition applies, also, to nets fed by module PIs from the board. The same scale factor should be used to provide correction of Delta I noise values.

To allow the Delta I analyzer 94 to treat such Delta I noise contributors accurately, the Delta I information file 81 contains one or two bytes of binary flag bits, half of which are for PO nets and half for PI nets. Default is to one byte, which allows for treatment of up to four packaging levels above the chip 12. Use of two bytes allows for a total of nine levels of packaging, including chips.

In either case, the right-most half of the field identifies fanout to packaging levels above the chip, with the right-most bit indicating fanout to a PO of the first packaging level above the chip and the next bit to a PO of the next packaging level, etc. The bits in the left half field, starting from its rightmost bit, identify net fanin from a PI to the first packaging level above the chip, etc.

Figure 4:
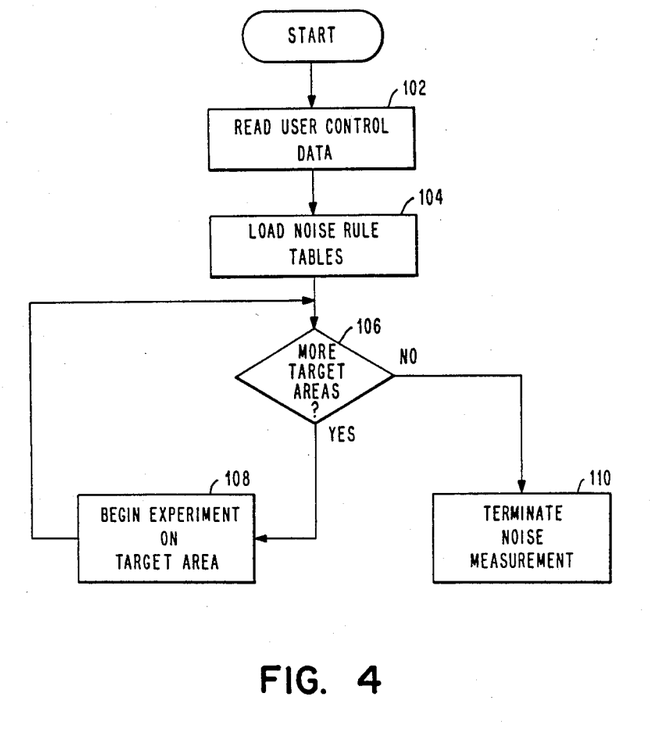
FIG. 4 is a flow chart of operations in the Delta I calculator-analyzer.

Referring now also to FIG. 4, the steps of the operation of the Delta I calculator-analyzer 94 are shown. User supply control data is read, step 102. This data includes the definition of the structure to be processed, a particular simulation experiment whose results are to be interpreted, any updates to the Delta I noise rules 62 and 100, a specific target area 22 definition for the subexperiments to be run and any special control information. Such control information can include the definition of facilities and estimated Delta I commands and stipulations as to whether a full error message is to be generated for every violation or whether processing should be allowed to continue for a predetermined number of violations in order to conserve paper, for example. Control information can also include definitions of time ranges on the activity file 90.

The noise rule tables 62 and 100 are then loaded into main storage, step 104. Any user specified updates are performed. These tables 62 and 100 are then reformatted for computational efficiency so that the analyzer 94 need add only absolute amounts for the subevents which make up any Delta I noise event.

The decision block, step 106, determines whether any additional target area is to be processed. If so, a specific experiment is performed on the target area, step 108. The specified controls are applied, events are read on the activity file 90 and the noise is measured. User messages are printed or displayed and the experiment is completed. Printing or display of a summary message occurs.

For a given analysis experiment, the Delta I calculator-analyzer 94 reads and responds to all control input and sequentially processes all events within the selected time range on the Delta I activity file 90. As each event is read, reference is made to the CUT "participation" table, not shown, to determine whether the event affects any Delta I noise contributor(s) in the CUTs of interest and, if so, to the Delta I information file 81 to get the index to the proper section of the appropriate Delta I rule in the in-core composite table of Delta I tabular rule data 100. The Delta I noise activity contributed by the value transition specified in the event is read from that section. Events specified by a given set of time and stimulus commands can, of course, be multiple.

For events on the primary chip of interest 24 (FIG. 1), the incremental Delta I noise activity is added directly to the instantaneous Delta I noise activity total, while activity contributed by events on nearest neighbor adjacent chips 12 are scaled before being added to the total instantaneous activity. Scaling must be done, also, for events in nets whose fanout or fanin includes POs or PIs respectively of packaging levels above the TCM.

This implementation is consistent with the additive nature of Delta I noise, reflected by the following Delta I noise activity inequality, determined by the package development engineers and supported in the Delta I noise rules 100:

$$SA1 + K2 \cdot SA2 \leq MAX. \text{ DELTA I ALLOWED},$$

where:
SA1 = total instantaneous Delta I noise on primary chip of interest 24,
SA2 = total instantaneous Delta I noise on secondary (adjacent) chips of interest 12, and
K2 = a scale factor determined by technologists to account for Delta I noise effects from adjacent chips 12.

The Delta I analyzer 94 allows for the existence of tertiary or higher levels of chips of interest. Default for the analyzer 94 is to process all chip CUTs in the structure as primary chips of interest.

In processing a Delta I activity file 90 derived from a static mode simulation results file 86 or from a file produced by another logic simulator, not shown, via reference numeral 87, the analyzer 94 does not attempt to account for Delta I noise or time *between* patterns. Only the timed succession of events *within* patterns is considered to be of consequence, since stability is reached within patterns and maintained therebetween.

At the completion of each experiment, as described hereinbelow, the Delta I noise analyzer 94 furnishes to the user summary messages regarding the occurrences of violations of either the maximum Delta I noise activity allowed or of the user selected threshold. One such message states the amount of noise remaining in all summations at the end of any experiment which should be substantially zero. All messages are formatted to allow printing, display via terminal or any other suitable means of communication with the user.

If the final target area 22 has been processed, step 106, the overall experiment is terminated, step 110.

Figure 5:
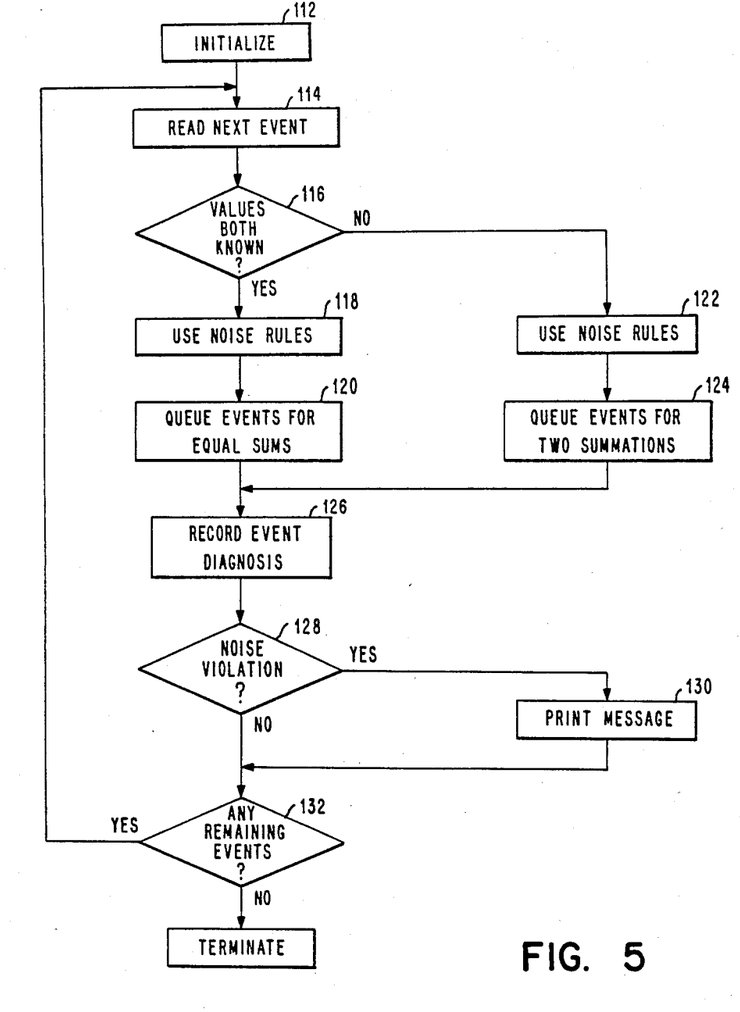
FIG. 5 is a flow chart of analysis performed in the Delta I calculator-analyzer.

Referring now also to FIG. 5, there is shown an expansion in flow diagram form of step 108 (FIG. 4). Initialization of the queues and summations to zero is performed, step 112. If there is a next noise event, it should be read from the activity file 90, step 114. The system determines whether the value from which the transition is to be made and the value to which it is to go are both known, step 116. If so, for the particular event of the identified contributor, the system accesses the noise in the Delta I noise rule tables 100, shown in Tables I and II, step 118. The noise subevents indicated in those tables 100 are then enqueued for two sums equally, step 120. If, however, either a from event or a to event is not known but is an uninitialized of an unknown value, a similar lookup is performed in the noise rules tables 100, Tables I and II, step 122.

TABLE I

DELTA I RULE-CHIP (TABLE DETAIL)

| INDEX | FLAG VALUE | RCW | SUB-EVENT RELATIVE TIME | DELTA I NOISE (BY TRANSITION) | | | | | |
|---|---|---|---|---|---|---|---|---|---|
| | | | | 0→1 | 1→0 | 0→H | H→0 | 1→H | H→1 |
| (0) | (1.0) | (0) | 7 | −5.00 | +3.50 | −3.00 | −2.80 | +2.00 | +1.80 |
| (1) | | (1) | 0 | −0.75 | +0.50 | −0.40 | −0.40 | +0.30 | +0.30 |
| (2) | | (2) | 300 | +4.00 | −3.00 | +2.20 | +2.00 | −1.70 | −1.50 |
| (3) | | (3) | 700 | −5.00 | +3.50 | −3.00 | −2.80 | +2.00 | +1.80 |
| (4) | | (4) | 1100 | +2.00 | −1.30 | +1.00 | +1.20 | −0.90 | −0.60 |
| (5) | | (5) | 1500 | +0.50 | −0.30 | +0.30 | +0.30 | −0.20 | −0.10 |
| (6) | | (6) | 1900 | +0.30 | −0.10 | +0.20 | +0.20 | −0.10 | −0.10 |
| (7) | | (7) | 2300 | 0.00 | 0.00 | 0.00 | 0.00 | 0.00 | 0.00 |
| (8) | (2.0) | (0) | 5 | −4.50 | +3.50 | 0.00 | 0.00 | 0.00 | 0.00 |
| (9) | | (1) | 0 | −1.00 | +1.00 | 0.00 | 0.00 | 0.00 | 0.00 |
| | | (2) | 500 | −3.00 | +2.00 | 0.00 | 0.00 | 0.00 | 0.00 |
| | | (3) | 900 | −4.50 | +3.50 | 0.00 | 0.00 | 0.00 | 0.00 |
| | | (4) | 1700 | −2.20 | +2.00 | 0.00 | 0.00 | 0.00 | 0.00 |
| | | (5) | 2100 | 0.00 | 0.00 | 0.00 | 0.00 | 0.00 | 0.00 |
| | (3.0) | (0) | 4 | | | | | | |
| | | (1) | 0 | | | | | | |
| | | (2) | 700 | | | | | | |
| | | (3) | 1400 | | | | | | |
| | | (4) | 2000 | | | | | | |
| | (4.1) (etc) | (0) | | | | | | | |
| (n) | | (nn) | | | | | | | |

Note: Row 0 of each section/subsection contains the number of sub-events (in sub-event relative time field) and peak value (in each of the transition field columns).

TABLE II

DELTA I RULE-CHIP (ADJUSTING TABLE)

| INDEX | FLAG VALUE | RCW | SUB-EVENT RELATIVE TIME | DELTA I NOISE INCREMENTAL VALUES (BY TRANSITION) | | | | | |
|---|---|---|---|---|---|---|---|---|---|
| | | | | 0→1 | 1→0 | 0→H | H→0 | 1→H | H→1 |
| (0) | (1.0) | (0) | 7 | −5.00 | +3.50 | −3.00 | −2.80 | +2.00 | +1.80 |
| (1) | | (1) | 0 | | −0.75 | +0.50 | | | |
| (2) | | (2) | 300 | | +4.75 | −3.50 | | | |
| (3) | | (3) | 700 | | −9.00 | +6.50 | | | |
| (4) | | (4) | 1100 | | +7.00 | −4.80 | | | |
| (5) | | (5) | 1500 | | −1.50 | +1.00 | | | |
| (6) | | (6) | 1900 | | −0.20 | +0.20 | | | |
| (7) | | (7) | 2300 | | −0.30 | +0.10 | | | |
| (8) | (2.0) | (0) | 5 | | | | | | |
| (9) | | (1) | 0 | | | | | | |
| | | (2) | 500 | | | | | | |
| | | (3) | 900 | | | | | | |
| | | (4) | 1700 | | | | | | |
| | | (5) | 2100 | | | | | | |
| | (3.0) | (0) | 4 | | | | | | |
| | | (1) | 0 | | | | | | |
| | | (2) | 700 | | | | | | |
| | | (3) | 1400 | | | | | | |
| | | (4) | 2000 | | | | | | |
| | (4.1) etc. | (0) | | | | | | | |
| (n) | | (nn) | | | | | | | |

Note: Row 0 of each section/subsection contains the number of sub-events (in sub-event relative time field) and peak value (in each of the transition field columns).

The noise subevents are queued for sums A and B as shown in Table III, step 124. The following value transitions are supported, consistently with contributor capabilities, in the Delta I rules 100 corresponding to chips 12:

"0" to "1"
"1" to "0"
"0" to "H" (where H is the high impedance state)
"H" to "0"
"1" to "H"
"H" to "1"

When the high impedance state is not supported for Delta I measurement, transitions to and from "H38 are treated in the same manner as transitions to and from "1" to "0", with the appropriate value substituted for "H38.

At any time, the analyzer 94 knows the total instantaneous Delta I noise activity caused by transitions between known values. The analyzer 94 can check after each sub-event that the Delta I limit has not been exceeded. However, the known values 0, 1 and H are not the only values simulated. Attention must also be given to transitions to and from the values U and X.

Although U is an unknown value, it can be considered a stable value. Thus, transitions from U to a known value can be characterized as being either no change, if already at the new value, or a change from either of the two other known values (of the three: 0, 1, or H). If a change occurs, it causes a noise pulse.

While U is treated as a constant value, X cannot be. Since the meaning of X is less restrictive, X transitions cannot be treated as if they cause noise pulses at known times, but must be treated as causing a constant level of Delta I noise for the duration of the X.

The user can examine the messages provided and deal intelligently with them. The analyzer 94, therefore, performs two simultaneous Delta I noise summations, in which Delta I noise contributions resulting from known value transitions are treated identically. Transitions to or from U or X are given a different but consistent treatment in each of the two summations. That is, the two summations, hereinafter called summations "A" and "B", are biased in opposite polarities of Delta I noise caused by U and X transitions. Sum A consists of the noise from events in which a logic signal is going positive. Sum B consists of the noise from negative going logic signals. This assumes consistency, within logic and packaging technologies used, of the polarity of the Delta I noise produced with the polarity of causative signal transitions. If this condition does not exist, appropriate measures must be taken to assure that the summations are correct with regard to the peak noise contributions, regardless of polarity.

After each sub-event addition, each sum is checked against the Delta I noise limit set by the user or by the rules 100. The actual level of instantaneous Delta I activity lies between the two sums in value. The user must evaluate the situation as appropriate.

The following internal algorithm (Table III) is used for determining the value transitions (columns in the Delta I tabular rule 100 data) from which to take Delta I noise values when treating U or X transitions. It should be understood that Table III represents behavior of logic and packaging systems only where the noise contributed is consistent with the causative signals associated therewith, as discussed hereinabove.

TABLE III

| Transition Simulated | VALUE TRANSITIONS Transitions Assumed for: | |
|---|---|---|
| | Summation "A" | Summation "B" |
| 0 to (U or X) | 0 to 1 | 0 to 0 (no chg) |
| H to (U or X) | H to 1 | H to 0 |
| 1 to (U or X) | 1 to 1 (no chg) | 1 to 0 |
| (U or X) to 0 | 0 to 0 (no chg) | 1 to 0 |
| (U or X) to H | 0 to H | 1 to H |
| (U or X) to 1 | 0 to 1 | 1 to 1 (no chg) |
| U to X | 0 to 1 | 1 to 0 |
| X to U | 0 to 1 | 1 to 0 |

The values of Delta I noise used in sub-event generation for transitions to or from U are taken directly from the rules 100 as described above and are adjusted via a scale factor (default value=1.0) which may be overridden by the user. The values of Delta I noise used for X transitions are taken from the peak value of Delta I noise specified by the rules 100, accessed also as described above and adjusted via another scale factor whose default is set by the technology organization responsible for rule definition, but which is also user overridable. Thus, the user can independently tune the analyzer's 94 sensitivities to U and X transitions.

The use of appropriate sub-event operation codes allows for the use of one queue with multiple summation. A list of "active" contributors, event time, transitions and Delta I noise contributed (both sense and amplitude) is maintained in conjunction with the queue to supplement it and give the user detailed reporting of Delta I noise limit violation. This list also supports the summation of Delta I noise contributions from transitions to X, which are of indefinite length in that each lasts until the next base event on its contributor.

Event diagnosis data is then recorded in its queue, step 126. When the summation is performed, the system determines which contributor blocks are contributing to the noise in the sums and when they are doing so.

The total instantaneous Delta I noise activity is monitored. This activity is compared against the maximum values allowed and any lower threshold values the user may have named on the action statement. If either value is exceeded, a warning message is produced to tell the user the time, the total value, the contributors (in terms of user names, via reference to the Delta I information file 81), their respective value transitions and their individual contributions.

Because the user can specify a range of event times on the Delta I activity file 90 for the analyzer 94 to process, the analyzer 94 is implemented so as to begin processing earlier than the specified start time. Similarly, the analyzer 94 finishes processing later than the specified stop time by an amount of time equal to the maximum noise pulse width named in the Delta I rules 100 used. This assures correct summation across the selected time range and makes it possible to self-check at the conclusion of each experiment.

It is possible for the maximum allowable value of instantaneous Delta I noise or the user-selected Delta I noise threshold to be exceeded continuously over a long series of events from a Delta I noise activity file 90. Therefore, in the control input, the user can specify a maximum number of such events over which the analyzer 94 provides a detailed message and-beyond which only the warning, the time and the total instantaneous Delta I noise values is given. Default is to provide detailed messages for the first ten events of such a series.

The system then determines whether a noise violation has been observed either in sum A or sum B, step 128. If the answer is yes, a full or short message is printed, step 130, as determined by the consecutive violation event counter. Normally, a long message with full diagnostic information is printed for the first ten violations. After that, a shorter form of message is printed in order to conserve display facilities and printing materials.

If no violation occurs, the system determines whether any remaining events are to be processed, step 132. If so, step 114 is re-executed and processing continues. If no events remain, step 132, summation terminates when all sum queues are empty, step 134.

Inasmuch as certain changes may be made in the above described invention without departing from the spirit and scope of the same, it is intended that all matter contained in the above description or shown in the accompanying drawings shall be interpreted in an illustrative rather than limiting sense. Moreover, it is intended that the following claims be interpreted to cover all the generic and specific features of the invention herein described.

What is claimed is:

1. In a computerized simulation model for analyzing composite logic circuits having devices for switching significant amounts of current, a system for detecting and diagnosing noise caused by current switching comprising:

(a) logic simulation means for simulating logic experiments and for retaining and communicating results thereof;
(b) noise contributor information file generating means for providing identification data corresponding to each current switching device that contributes noise and for enabling post analysis of the results said simulation;
(c) a noise activity file generator connected to said logic simulation means for employing said simulation results to create an activity file of events that represents the operation of those current switching devices identified by said noise contributor information file generating means; and
(d) a noise calculator-analyzer connected to said noise activity file generator for determining the amount of noise created by each noise contributing current switching device and for measuring the total instantaneous noise at each event in said activity file.

2. The system in accordance with claim 1 wherein said noise contributor information file generating means comprises:
(a) an information file which references said logic simulation means and identifies noise contributing current switching devices, multi-source nets and delay information; and
(b) an information file generator for receiving the contents of said logic simulation means and generating said information file.

3. The system in accordance with claim 1 wherein said noise activity file generator creates simulation events in time-sequential order.

4. The system in accordance with claim 1 wherein said noise contributor information file generating means provides delay data to enable supplementary simulation during noise activity file generation.

5. The system in accordance with claim 1 wherein said noise activity file generator determines whether a related event must be generated.

6. The system in accordance with claim 5 wherein said noise activity file generator creates and inserts a noise event on a previously unsimulated non-logical noise contributing element into said activity file when said related event must be generated.

7. The system in accordance with claim 6 wherein said noise activity file generator creates and inserts said noise event by performing supplementary simulation and filtering.

8. The system in accordance with claim 6 wherein said previously unsimulated non-logical noise contributing element is a transmission line terminator.

9. The system in accordance with claim 1 wherein said noise contributing current switching device is a driver.

10. The system in accordance with claim 9 wherein said driver is located at a position remote from the chip corresponding thereto.

11. The system in accordance with claim 9 wherein said driver is located at a position remote from the module corresponding thereto.

12. The system in accordance with claim 1 wherein said composite logic circuits reside on a plurality of integrated circuit chips disposed on a multi-chip module.

13. The system in accordance with claim 12 wherein a cluster of said plurality of chips can be selected for analysis.

14. The system in accordance with claim 13 wherein successive clusters of chips can be analyzed.

15. The system in accordance with claim 1 further comprising:
means connected to said noise calculator-analyzer for indicating an error when said total instantaneous noise at one event exceeds a predetermined limit.

16. The system in accordance with claim 15 wherein said predetermined limit is a positive limit.

17. The system in accordance with claim 15 wherein said predetermined limit is a negative limit.

18. The system in accordance with claim 15 wherein said error indicating means is a printer.

19. The system in accordance with claim 15 wherein said error indicating means is a visual display.

20. The system in accordance with claim 15 wherein said error indicating means indicates the time said excessive noise occurred.

21. The system in accordance with claim 15 wherein said error indicating means indicates the amplitude of said excessive noise.

22. The system in accordance with claim 15 wherein said error indicating means identifies the noise-contributing current switching devices at the time of said excessive noise.

23. The system in accordance with claim 22 wherein said error indicating means identifies the sense of each of said noise contributing current switching devices.

24. The system in accordance with claim 15 further comprising:
a noise rule comprising said predetermined noise limit, said rule being accessible by said noise calculator-analyzer.

25. The system in accordance with claim 24 wherein the highest value of noise in said noise rule entry is applied for the duration of the unknown value.

26. The system in accordance with claim 24 wherein said noise rule further comprises data representing the quantity of noise attributable to each of said identified noise contributing current switching devices corresponding thereto.

27. The system in accordance with claim 15 wherein the system continues to process information after an error is indicated.

28. The system in accordance with claim 27 wherein the system ceases to process information only after a predetermined number of errors is indicated.

29. A simulation system for detecting and diagnosing noise generated by at least one device in a logic circuit comprising:
(a) logic simulation means for simulating a logic experiment and for retaining and communicating results thereof;
(b) information file generating means for providing identification data corresponding to each noise contributing device in said logic experiment;
(c) activity file generating means connected to said logic simulation means for employing said simulation results to create an activity file of events that represents the operation of those devices identified by said information file generating means; and
(d) analyzing means connected to said activity file generating means for determining the amount of noise created by each noise contributor and for measuring the total instantaneous noise by bounding each of said noise contributors.

30. The system in accordance with claim 29 wherein said bounding is accomplished by performing two separate summations.

31. The system in accordance with claim 30 wherein one of said summations is based on the premise thit the change required of an uninitialized value is positive and the other of said summations is based on the premise that the change required of an uninitialized value is negative.

32. A simulation method for detecting and diagnosing noise generated by at least one device in a logic circuit, the steps comprising:
(a) simulating a logic experiment;
(b) identifying data corresponding to each device that contributes noise;
(c) performing post analysis of the results of said simulation as enabled by said identifying data;
(d) creating an activity file of events representing the operation of each of said identified noise contributing devices; and
(e) determining the total amount of instantaneous noise created by the noise contributing devices.

33. The method in accordance with claim 32, the steps further comprising:
measuring the total instantaneous noise at each event in said activity file.

34. The method in accordance with claim 33 wherein said measurement of the total instantaneous noise is accomplished by a single summation.

35. The method in accordance with claim 33 wherein said measurement of the total instantaneous noise is accomplished by bounding each of said noise contributing devices.

36. The method in accordance with claim 35 wherein said bounding is accomplished by performing two summations.

37. A simulation based analysis model for detecting and diagnosing noise generated by at least one device in a logic circuit comprising:
logic simulation means for simulating a logic experiment;
(b) information file generating means for providing identification data corresponding to each noise contributing device in said logic experiment;
(c) activity file generating means connected to said logic simulation means for creating an activity file of events that represent the operation of devices identified by said information file generating means; and
(d) analyzing means connected to said activity file generating means for determining the amount of noise created by each noise contributor and for measuring the total instantaneous noise by a single summation at each event in said activity file.

* * * * *